United States Patent [19]
Benko et al.

[11] Patent Number: 5,186,756
[45] Date of Patent: Feb. 16, 1993

[54] MOCVD METHOD AND APPARATUS

[75] Inventors: John W. Benko, Trenton; Jerome Levkoff, Ewing, both of N.J.; Daniel C. Sutryn, Wyomissing Hills, Pa.; Montri Viriyayuthakorn, Hamilton Square, N.J.

[73] Assignee: AT&T Bell Laboratories, Murray Hill, N.J.

[21] Appl. No.: 803,938

[22] Filed: Dec. 9, 1991

Related U.S. Application Data

[62] Division of Ser. No. 471,458, Jan. 29, 1990, now U.S. Pat. No. 5,106,453.

[51] Int. Cl.$^5$ .............................................. C23C 16/46
[52] U.S. Cl. ................................. 118/730; 118/715; 118/725
[58] Field of Search ................ 118/715, 725, 730

[56] References Cited

U.S. PATENT DOCUMENTS

| | | | |
|---|---|---|---|
| 3,637,434 | 1/1972 | Nakanuma et al. | 117/201 |
| 4,369,031 | 1/1983 | Goldman et al. | 432/198 |
| 4,499,853 | 2/1985 | Miller | 118/725 |
| 4,625,678 | 12/1986 | Shioya | 118/723 |

FOREIGN PATENT DOCUMENTS

| | | |
|---|---|---|
| 57-48226 | 3/1982 | Japan . |
| 60-116126 | 6/1985 | Japan ................................... 118/728 |
| 61-208222 | 9/1986 | Japan . |

OTHER PUBLICATIONS

"Metalorganic Chemical Vapor Deposition," by P. Dapkus, *Annual Review of Material Sciences*, 1982, vol. 12, pp. 243–269.

"Metalorganic Chemical Vapor Deposition of III–V Semiconductors," by M. J. Ludowise, *Journal of Applied Physics*, vol. 58, No. 8, Oct. 15, 1985, pp. 31–55.

"Si Epitaxial Growth of Extremely Uniform Layers by a Controlled Supplemental Gas Adding System," by T. Suzuki et al., *Journal of Electrochemical Society*, vol. 132, No. 6, Jun. 1985, pp. 1480–1487.

*Primary Examiner*—Richard Bueker
*Attorney, Agent, or Firm*—R. B. Anderson

[57] ABSTRACT

In an MOCVD reactor, gases are channeled around the periphery of a baffle plate (15) so as to flow radially inwardly along a slotted injection plate (16). The slots (22) in the injection plate extend radially and are of non-uniform width so as to compensate for a non-uniform rate of deposition. The resultant flow over a rotating heated substrate (17) gives a more uniform deposit of epitaxially grown material.

5 Claims, 6 Drawing Sheets

MOCVD METHOD AND APPARATUS

This is a division of application Ser. No. 07/471,458 filed Jan. 29, 1990, now U.S. Pat. No. 5,106,453.

TECHNICAL FIELD

This invention relates to methods and apparatus for making semiconductor devices, and, more particularly, to methods and apparatus for making epitaxial layers by metalorganic chemical vapor deposition (MOCVD).

BACKGROUND OF THE INVENTION

One of the most significant developments in semiconductor technology in recent years has been the increased use of III-V materials such as gallium arsenide and indium phosphide, and their ternary and quaternary alloys such as indium-gallium-arsenide-phosphide, as the active material of semiconductor devices. The band gap characteristics of such materials typically make them candidates for optoelectronic and photonic applications such as lasers, light emitting diodes and photodetectors. For integrated circuit use, their high electron mobility often makes them preferable to the more commonly used semiconductor, silicon. Fabrication of such devices often requires epitaxial growth of one or more layers on a single-crystal substrate (epitaxial growth refers to a method of depositing a material on a substrate such that the crystal structure of the deposited material effectively constitutes an extension of the crystal structure of the substrate).

The three broad classes of methods for depositing by epitaxial growth are liquid phase epitaxy, vapor phase epitaxy and molecular beam epitaxy which, respectively, involves deposition from a liquid source, a vapor source and a molecular beam. A particularly promising form of vapor phase epitaxy is a method for depositing from a gas including a metalorganic compound; this process, known as metalorganic chemical vapor deposition (MOCVD), is described in a number of scientific publications including, "Metalorganic Chemical Vapor Deposition of III-V Semiconductor," M. J. Ludowise, *Journal of Applied Physics*, Vol. 58, No. 8, Oct. 15, 1985, pp. R31-R55, and the paper, "Metalorganic Chemical Vapor Deposition," P. Daniel Dapkus, *American Review of Material Sciences*, Annual Reviews, Inc., 1982, pp. 243-268. MOCVD processes make use of a reactor in which a heated substrate is exposed to a gaseous metalorganic compound containing one element of the epitaxial layer to be grown and a gaseous second compound containing another element of the desired epitaxial material. For example, to grow the III-V material gallium arsenide, one may use the metalorganic gas triethylgallium $[(C_2H_5)_3Ga]$ as the gallium source and arsine $(AsH_3)$ as the source of the group V component, arsenic. The gas mixture is typically injected axially at the top of a vertically extending reactor in which the substrate is mounted on a susceptor that is heated by a radio-frequency coil. The gases are exhausted from a tube at the end of the reactor opposite the input end.

While MOCVD offers many recognized advantages over other forms of epitaxy, several problems remain in the formation of high quality devices. Chief among these is the problem of obtaining good uniformity of deposition along the upper surface of the substrate. Since the proper operation of devices such as semiconductor lasers requires several different epitaxial layers, each only a few microns thick, it can be appreciated that significant deviations of thickness uniformity may result in serious differences in the operation of such lasers. Moreover, use of such devices in systems requires a great deal of reproducibility in their production which cannot be achieved if a sufficient uniformity of deposited layer thicknesses is not obtained.

SUMMARY OF THE INVENTION

The invention is an improvement of a reactor of the type in which MOCVD gases are directed into one end of the reactor containing the heated substrate and exhausted from the other end. The gases are channeled and guided so as to flow through a slot or slots in an injection plate that is arranged generally parallel to the substrate. The slots have a non-uniform width which allows a non-uniform injection of gases to compensate for a non-uniform deposition rate. The substrate is rotated during the deposition.

Both the substrate and the injection plate are typically horizontally arranged along the central axis of the reactor. The slots in the injection plate are preferably arranged radially with respect to the center of the injection plate with each slot being narrower at the end nearest the center than at the end nearest the periphery of the injection plate. A baffle plate is preferably located above and parallel to the injection plate and opposite the substrate. The input gases are directed against the center of the baffle plate and are guided around the periphery of the baffle plate so that they thereafter flow in a radially inward direction along the surface of the injection plate opposite the substrate.

The embodiments that have been found to be preferred use injection plates having either two or four radially extending slots. These slots may be made in the injection plate by making the plate of quartz, mounting it on an X-Y table, and using known computer-controlled apparatus to drive the injection plate with respect to a laser beam that cuts a desired pattern in the injection plate corresponding to the slot periphery. After cutting the pattern representative of a single slot, the interior of the cut portion simply drops from the injection plate. The process is repeated for each of the other slots.

As will be explained later, epitaxial layers made by metalorganic chemical vapor deposition (MOCVD) in accordance with applicants' method and apparatus have a greater thickness uniformity than can be obtained by use of comparable apparatus of the prior art. These and other objects, features and benefits of the invention will be understood from a consideration of the following detailed description taken in conjunction with the accompanying drawing.

DETAILED DESCRIPTION

It is to be understood that, while an effort has been made to show the relative sizes of the elements in the drawing, the drawing is not intended necessarily to show the various elements to scale. Also, the following description is made largely for the purpose of describing the nature of the invention and how it is to be used. A working reproduction of the embodiments described presupposes a knowledge of the prior art, as typified by the reference cited above.

Figure 1:
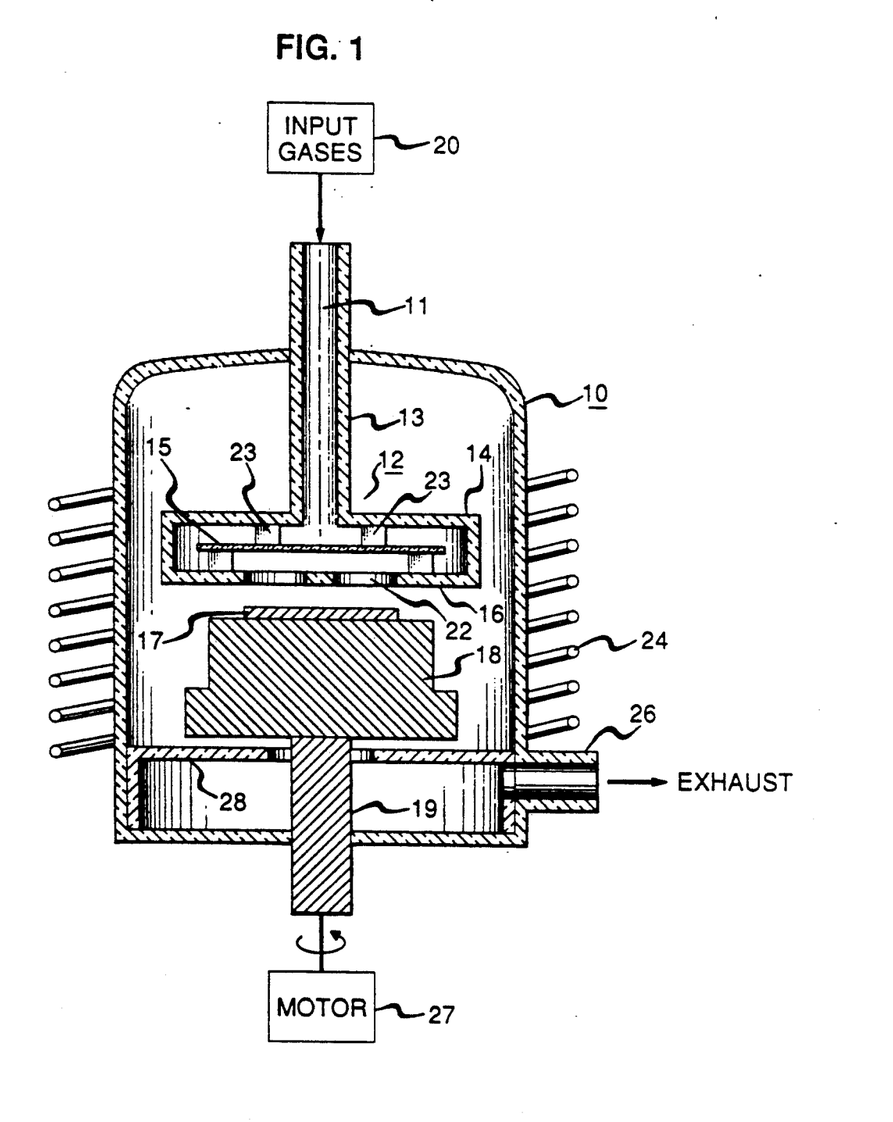
FIG. 1 is a schematic sectional view of an MOCVD reactor in accordance with one embodiment of the invention.
Figure 2:
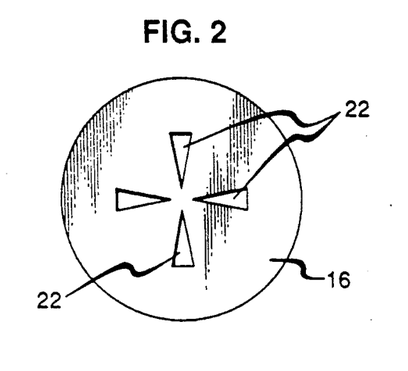
FIG. 2 is a bottom view of the injector plate 16 of the reactor of FIG. 1, in accordance with one embodiment of the invention.

Referring now to FIG. 1, there is shown an MOCVD reactor having an enclosure 10 and a central axis 11. A gas input manifold 12 comprises a gas inlet tube 13, a gas guiding member 14, a baffle plate 15 and an injector plate 16. A single-crystal semiconductor substrate 17 is mounted on a susceptor 18, which in turn is supported by a support member 19. The inlet tube 13 transmits input gases from a source 20 such as to flow around baffle plate 15 and through slots in injector plate 16 such that the gas can impinge on the substrate 17. FIG. 2, which is a bottom view of injector plate 16, illustrates the configuration of slots 22. Baffle plate 15 is disk-shaped, is solid, and is separated from members 14 and 16 by spacer members 23.

The substrate 17 is heated by susceptor 18, which in turn is heated by a radio-frequency coil 24 surrounding the enclosure 10. The substrate 17 is a single crystal of a compound semiconductor material such as a III-V material or a II-VI material. The substrate may illustratively be monocrystalline n-doped indium phosphide (InP), a III-V material. The purpose of the reactor is to cause components of the input gases to deposit on the upper surface of the substrate 17 such as to form an epitaxial layer on the substrate. The gases include a metalorganic gas containing a metal element of the epitaxial layer to be grown, and a gaseous second compound containing another element of the desired epitaxial material. With the wafer properly heated, these components react near the surface of the wafer to form an epitaxial layer in accordance with known MOCVD principles. The remaining part of the gas is removed from the enclosure 10 through an outlet tube 26.

During deposition, the susceptor and wafer are driven to rotate by a motor 27 which equalizes to some extent the thickness of deposition. A lower baffle 28 prevents the asymmetric location of the outlet tube 26 from creating asymmetries in the gas flow over wafer 17. With a substrate of indium phosphide, the metalorganic compound of the input gas may be trimethylindium [$(CH_3)_3In$], which is a source of indium, and the second compound may be phosphine ($PH_3$), which is a source of phosphorous. These components react to form an epitaxial layer of indium phosphide over the indium phosphide substrate 17; that is, the layer constitutes a crystal extension of the crystal structure of the substrate.

Figure 3:
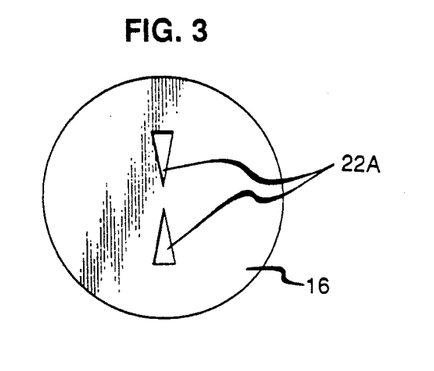
FIG. 3 is a schematic view of an injection plate in accordance with another embodiment of the invention.

In accordance with one feature of the invention, the thickness uniformity of the deposited epitaxial layer is greatly improved by the method we use for injecting the input gases into the region above substrate 17. The gas may be injected toward the wafer through four slots 22 in the injection plate 16 as shown in FIG. 2, or through only two slots 22A as illustrated in FIG. 3. In either case, the slots are radially extending and of varying width; in the FIGS. 2 and 3 embodiments, each slot is narrower at the end nearest the center of the injection plate than at the end nearest the periphery of the injection plate 16. The purpose of these embodiments is to combat a tendency, common to vertical flow MOCVD reactors of the prior art, for the gas precursors to deposit more thickly on the center of the substrate 17 than at the substrate periphery.

Figure 4:
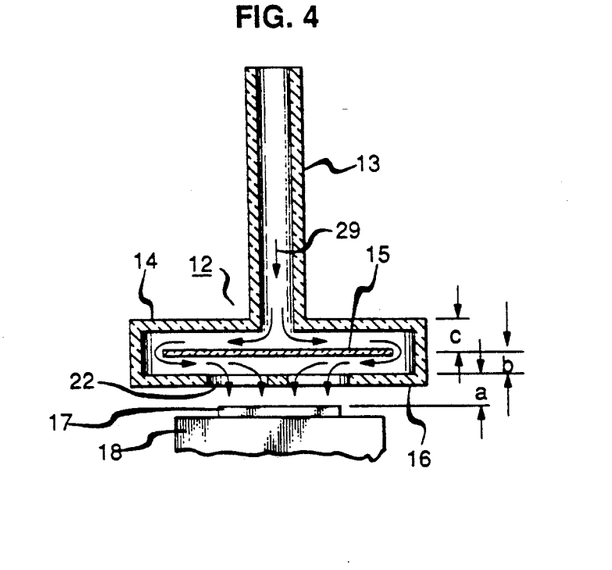
FIG. 4 is a schematic view of part of the reactor of FIG. 1.

Referring to FIG. 4, with either embodiment, the input gases follow a path 29 through the input manifold 12 as shown so as to be injected through slots in the injection plate 16 toward the substrate 17. The gases are initially projected against the center of the baffle plate 15, they are caused to flow around the periphery of the baffle plate, and thereafter flow radially inwardly along the upper surface of the injection plate 16. As they flow radially inwardly, they are injected through slots 22 toward the substrate. Many reactor designs were tried in an effort to combat a tendency in reactors of the prior art for the layer to deposit more thickly toward the center of the wafer, but only the designs shown in FIGS. 1-4, as will be explained more fully later, consistently gave thickness uniformities of ±10 percent deviation over ninety percent of the area of the substrate. Another advantage of using the baffle plate is that it induces a more laminar flow and a higher velocity to the gas which reduces spurrious deposition on the inner surfaces of manifold 12. A circle connecting the outer edges of the slots should have a larger diameter than a circle connecting the outer edges of the substrate, both of which are centered on central axis 11.

Figure 5:
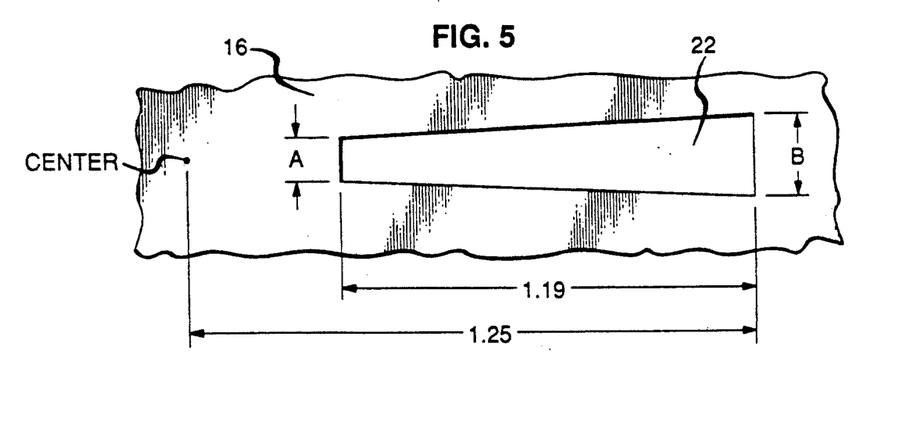
FIG. 5 is a view of a slot that may be used in the injector plate of FIGS. 2 or 3.
Figure 6:
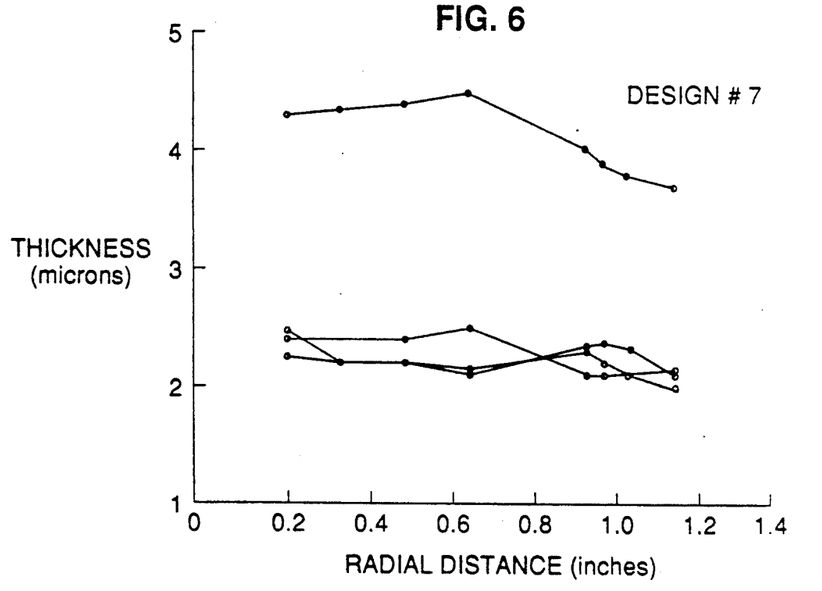
FIGS. 6 through 11 are graphs of thickness versus radial distance of various epitaxial layers made in accordance with various embodiments of the invention.
Figure 7:
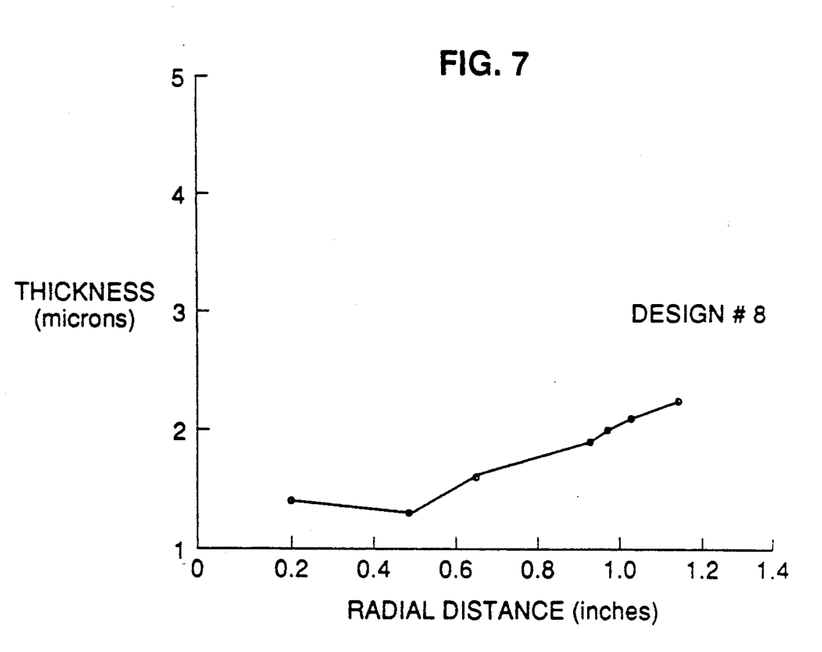
Figure 8:
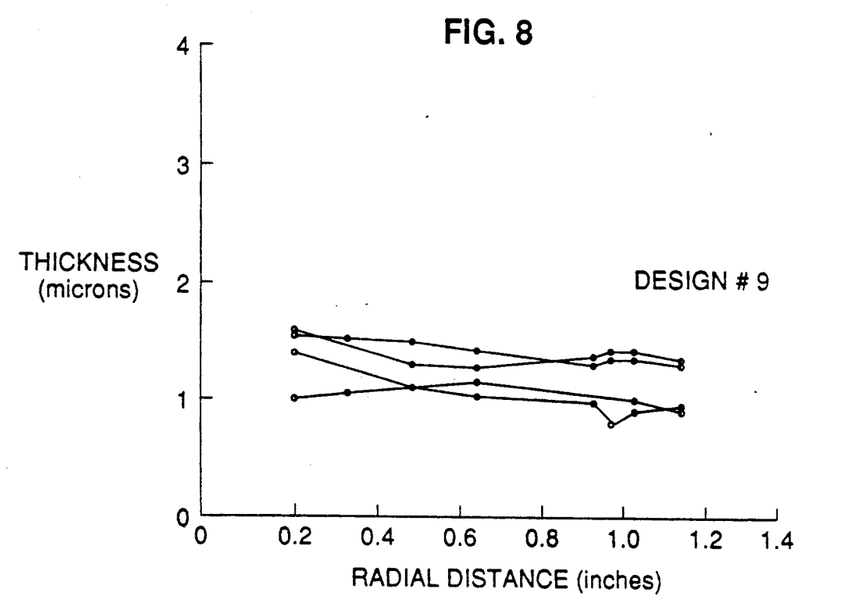
Figure 9:
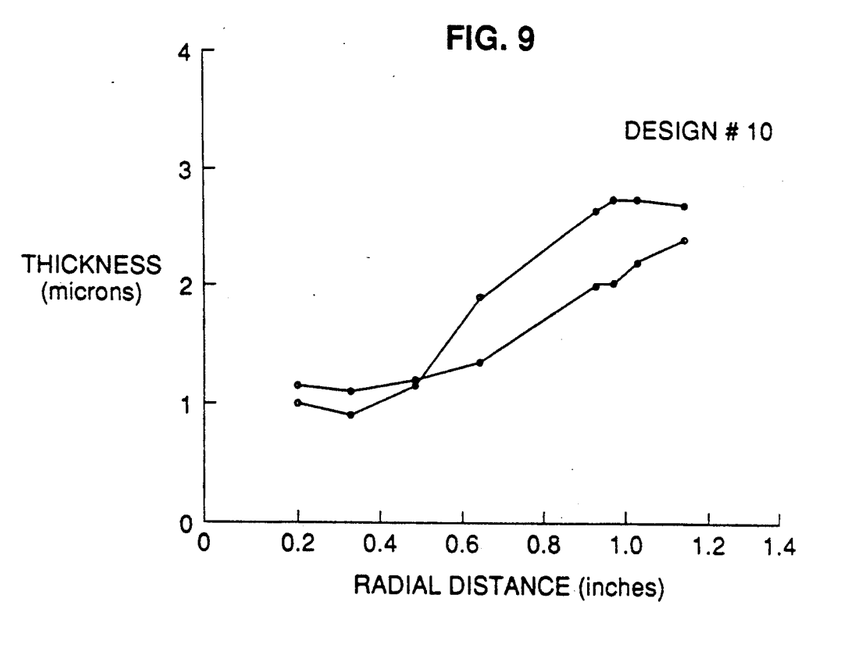
Figure 10:
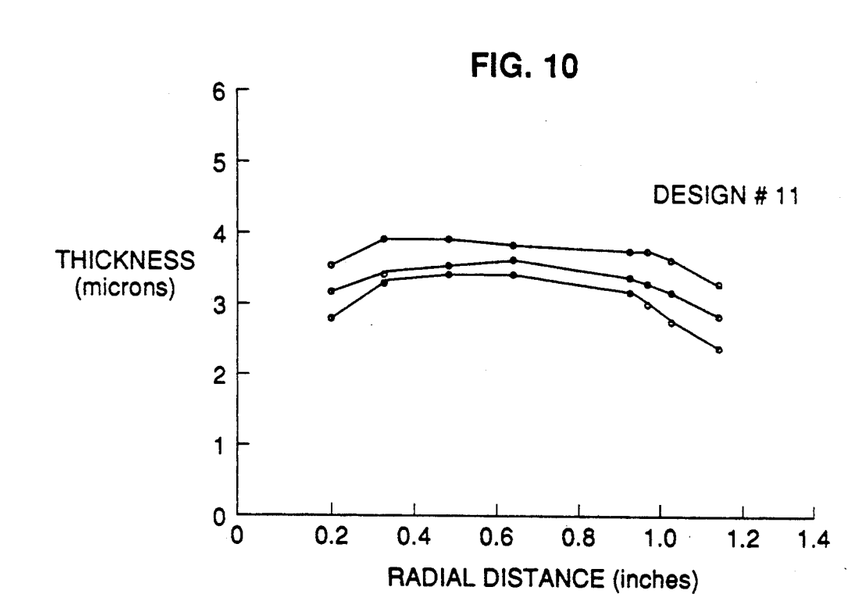
Figure 11:
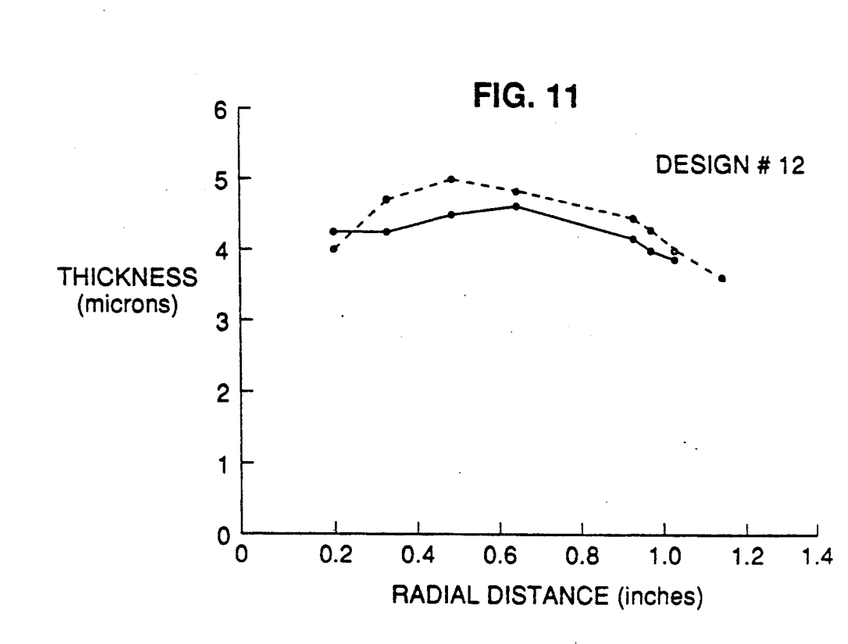

Referring to FIG. 4, typical dimensions for the reactor apparatus may be as follows: the distance a between the substrate 17 and the injector plate 16 may be one-half to four inches; the distance b between the injector plate 16 and the baffle plate 15 may be 0.05 to 0.2 inch; the distance c between the baffle plate 15 and the horizontal portion of the gas guiding means 14 may be 0.05 to 0.2 inch; the inner diameter d of the inlet tube may be 0.6 inch; the diameter of the baffle plate 15 may be 4.7 inches, the diameter of the injector plate 16 may be 4.9 inches. Referring to FIG. 5, the length of each of the slots 22 may be 1.19 inch, the distance between the far end of the slot and the center of the injector plate may be 1.25 inch, and the width A of the narrow end of the slot and the width B of the wide end of the slot may vary as will be discussed more fully later.

In demonstrations of the invention that were made, the input gases included hydrogen dilution flow rates of between 5 to 14 standard liters per minute (slm), trimethylindium at 40° C. was transported to the reactor by helium at 0.2 slm, and 10 percent of $PH_3$ in helium at 0.3 slm. Iron and silicon dopants were also used, including small amounts of $(C_5H_5)_2Fe$ for the iron, and a gas mixture of fifty parts per million of $SiH_4$ in helium for the silicon. Successful deposits were made with the dimension a of FIG. 4 being varied between 2.5 inch and 3.5 inches. The substrate 17 was comprised of four indium phosphide coupons (wafer portions), each having defined in it approximately two thousand indium phosphide lasers. The substrate was centrally located on the susceptor and had dimensions of 2.0 inch by substrate was centrally located on the susceptor and had dimensions of 2.0 inch by 1.6 inch. The total gas flow was eleven to sixteen slm. The substrate 17 was rotated at sixty rotations per minute.

A number of different designs for the injector plate 16 were made with either two or four slots, as shown in FIGS. 2 and 3 and with various slot dimensions, A and B, as shown in FIG. 5. Table 1 summarizes the different injector plate designs with different slot dimensions.

TABLE 1

| Design # | Number and Orientation of Slots | Slot Dimension (inches) | |
|---|---|---|---|
| | | A | B |
| 7 | 4 at 90° | 0.011 | 0.018 |
| 8 | 4 at 90° | 0.009 | 0.018 |
| 9 | 4 at 90° | 0.014 | 0.018 |
| 10 | 4 at 90° | 0.012 | 0.018 |
| 11 | 2 at 180° | 0.023 | 0.032 |
| 12 | 2 at 180° | 0.023 | 0.033 |

FIGS. 6–11 show the thickness variations for various films grown epitaxially with the designs 7–12 of Table 1. For example, in Table 1, Design Number 7 uses four slots arranged at 90°, as shown in FIG. 2, with the narrow and wide dimensions A and B of FIG. 5 being 0.011 and 0.018 inches, respectively. With this design, four runs were made under different conditions resulting in the four curves shown in FIG. 6. Most of these show thickness variations of less than plus or minus ten percent over ninety percent of the area of the substrate. Some of the designs clearly lead to more uniform layer thicknesses than others and no effort has been made to correct such data even though certain runs show greater non-uniformity. Nevertheless, it can be seen that, without undue experiment, the invention may be used to arrive at designs using both two and four slots having a high degree of thickness uniformity and reproducibility. Table 2 shows some of the variations in uniformity as a function of hydrogen flow for Design Number 11 and 12. The term "fused" indicates that the inlet tube 13 was permanently fused to enclosure 10.

TABLE 2

| | | Uniformity of Layers | | | |
|---|---|---|---|---|---|
| | | Hydrogen | Average | Uniformity | |
| Design # | Run # | Flow (slm) | Growth Rate (μm/hr) | 100% Area | 90% Area |
| standard jar | 2603 | 12 | 5.1 | 13% | 11% |
| 11 | 2571 | 10 | 6.0 | 16% | 11% |
| 11 | 2562 | 12 | 6.4 | 13% | 9.0% |
| 11 | 2570 | 12 | 7.4 | 9% | 3.8% |
| 11 fused | 2633 | 12 | 6.4 | 10% | 5.6% |
| 11 fused | 2634 | 12 | 6.7 | 8% | 6.4% |
| 12 | 2590 | 10 | 6.1 | 9.0% | 9.0% |
| 12 | 2602 | 12 | 4.3 | 9.5% | 4.0% |

Figure 12:
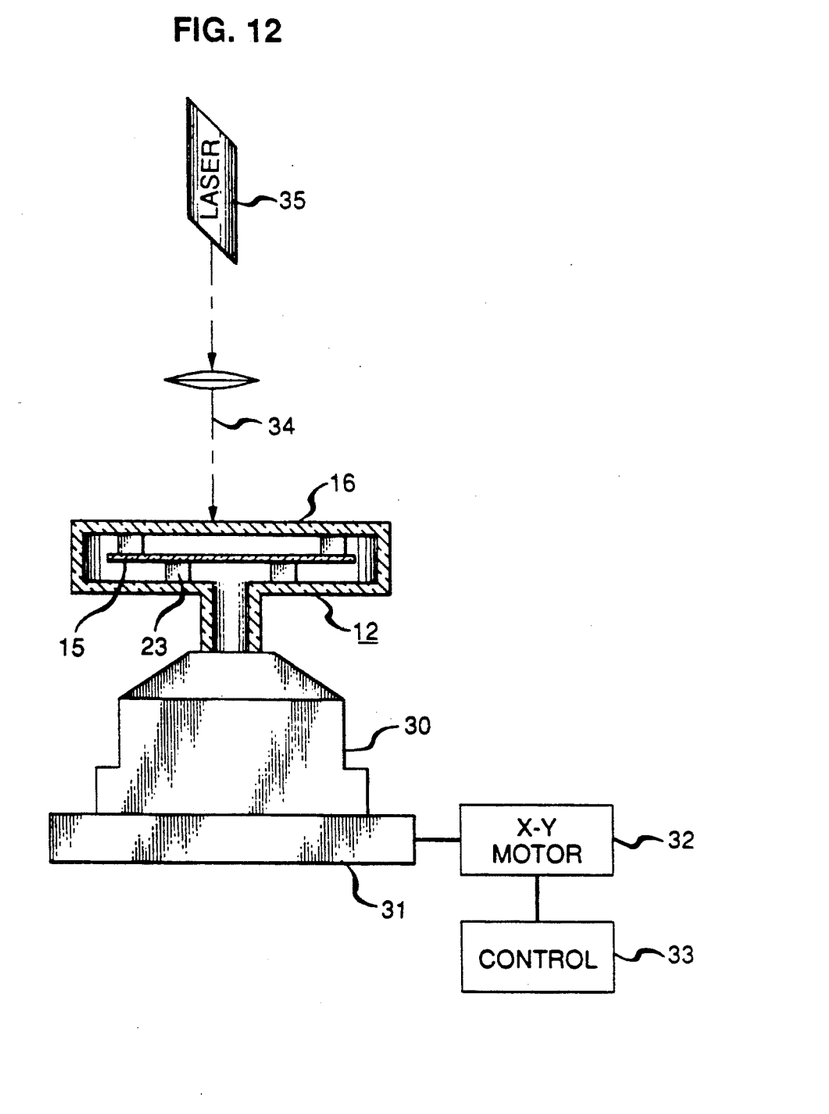
FIG. 12 is a view of a method for making injection plate slots in accordance with an illustrative embodiment of the invention.

FIG. 12 illustrates a method for cutting the slots 22 in the injector plate 16. The injector plate 16 is mounted by way of a chuck 30 on an X-Y table 31 driven by an X-Y motor 32, which is controlled by a control circuit or computer 33. The pattern of the outside periphery of the slot is programmed into the control circuit or computer 33 to drive the X-Y table 31 in that designated pattern. During this movement, a laser beam 34 from a laser 35 melts through the injector plate 16. After the entire pattern has been described by the laser beam, the interior portion of the pattern simply falls out to leave the desired slot in the injector plate. We use an Anorad III X-Y table as the table 31 and motor 32, which is available from the Anorad Company of Hauppauge, N.Y. A Photon Sources Model Number 108 carbon dioxide laser, commercially available from the Photon Sources Company of Livonia, Mich., was used as laser 35 and was operated in a continuously pulsed repetition mode. A pulse length of fifty milliseconds with an off time of ninety milliseconds was used, resulting in a pulse period of 140 milliseconds and a frequency of 7.14 Hertz. The laser current was adjusted to achieve forty watts average power. The injector plate 16 was a glass quartz plate having thicknesses between forty and eighty mils. The X-Y table 31 was driven at a rate of 2.25 inches per minute. Air was directed at the impingement of beam 34 on the injection plate 16 at forty pounds per square inch delivered through a 0.06 inch orifice at a distance of 0.07 inch above the plate. With these parameters, the laser cut through the plate as it was moved by the X-Y table to generate a slot having the desired dimensions without significantly damaging the baffle plate 15.

The various embodiments shown and described are intended to be merely illustrative of the inventive concept. The process is inherently empirical in that the slot widths are experimentally tailored to compensate for differences in the epitaxial growth rate, which may vary with variations in composition, flow rate and other parameters. By rotating the wafer as described, there are substantially no thickness variations at a common radial distance. Thickness differences at different radial distances, that would occur with a uniform flow rate, can be compensated by variations in the width of a single slot or plurality of slots as described. While a vertical reactor is preferred, other configurations could be used. It is known that II-VI epitaxial layers can be made by MOCVD, and the invention can be used in such processes. Various other embodiments and modifications may be made by those skilled in the art without departing from the spirit and scope of the invention.

We claim:

1. A metalorganic chemical vapor deposition reactor comprising:

an enclosure having a central axis;
a substrate holder within the enclosure;
means for rotating the substrate holder;
an inlet tube for transmitting gases into one end of the enclosure in an axial direction;
a baffle plate arranged transverse to said axis;
an injection plate parallel to the baffle plate and located on the side of the baffle plate opposite the inlet tube, the center of the injection plate being substantially coincident with the central axis of the enclosure;
means for guiding gases including metalorganic gases from the inlet tube around the periphery of the baffle plate so as to flow radially inwardly along one surface of the injection plate;
the substrate holder being arranged parallel to the injection plate and opposite the baffle plate;
and means comprising a plurality of slots in the injection plate for permitting said gases to be transmitted through the injection plate toward the substrate holder, the slots being arranged radially with respect to the center of the injection plate with each slot being narrower at the end nearest the center of the injection plate than at the end nearest the periphery of the injection plate, whereby the rate of transmission through the injection plate is non-uniform with respect to radial distance along said one surface of said injection plate.

2. The reactor of claim 1 wherein:

the substrate holder is adapted to hold a semiconductor substrate upon which it is desired to epitaxially deposit a semiconductor layer;

and the gases comprise a metalorganic compound and a second compound which are adapted to react so as to make an epitaxial deposit on the substrate.

3. The reactor of claim 2 wherein:

the injection plate contains two slots arranged 180 degrees apart with respect to the injection plate center.

4. The reactor of claim 2 wherein:

the injection plate contains four slots arranged ninety degrees apart with respect to the injection plate center.

5. The reactor of claim 2 wherein:

the slots are each made by directing at the injection plate a laser beam of sufficient power to melt locally through the injection plate, and causing relative movement of the plate with respect to the laser beam such that the point of impingement of the laser beam on the injection plate described a path corresponding to the periphery of the slot.

* * * * *